(12) United States Patent
Nakamura et al.

(10) Patent No.: US 6,592,958 B2
(45) Date of Patent: Jul. 15, 2003

(54) OPTICAL RECORDING MEDIUM AND SPUTTERING TARGET FOR FABRICATING THE RECORDING MEDIUM

(75) Inventors: Yuki Nakamura, Kanagawa (JP); Masaki Kato, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 62 days.

(21) Appl. No.: 09/863,472

(22) Filed: May 24, 2001

(65) Prior Publication Data

US 2002/0021594 A1 Feb. 21, 2002

(30) Foreign Application Priority Data

May 25, 2000 (JP) ........................................ 2000-155389

(51) Int. Cl.$^7$ ................................................. B32B 3/02
(52) U.S. Cl. ................... 428/64.1; 428/64.5; 428/64.6; 430/270.13; 419/35
(58) Field of Search ............................... 428/64.1, 64.4, 428/64.5, 64.6, 913; 431/270.13, 495.1, 745; 369/283, 288; 419/35

(56) References Cited

U.S. PATENT DOCUMENTS 5,736,657 A * 4/1998 Ide ............................. 75/230
5,785,828 A * 7/1998 Yamada ................. 204/298.13
6,022,605 A * 2/2000 Kaneko ..................... 428/64.1
6,177,167 B1 * 1/2001 Yuzurihara ................ 428/64.1
6,280,684 B1 * 8/2001 Yamada ....................... 419/54

FOREIGN PATENT DOCUMENTS

| EP | 0 717 404 | 6/1996 |
|---|---|---|
| EP | 0 735 158 | 10/1996 |
| EP | 0 898 272 | 2/1999 |
| EP | 0 962 924 | 12/1999 |
| EP | 1 030 292 | 8/2000 |

* cited by examiner

*Primary Examiner*—Elizabeth Mulvaney
(74) *Attorney, Agent, or Firm*—Oblon, Spivak, McClelland, Maier & Neustadt, P.C.

(57) ABSTRACT

An optical recording medium is provided with a recording layer made of a phase-change recording material including Ag, In, Sb, and Te as the main constituent elements, with the respective atomic percents of a, b, c, and d thereof being in the relationship of $0.1 \leq a \leq 5$, $5 \leq b \leq 13$, $62 \leq c \leq 73$, $22 \leq d \leq 26$, and $a+b+c+d \geq 97$. Alternatively, the recording material includes the constituent elements of Ag, In, Sb, Te, and Ge, with the respective atomic percents of a, b, c, d, and e thereof being in the relationship of $0.1 \leq a \leq 5$, $5 \leq b \leq 13$, $62 \leq c \leq 73$, $22 \leq d \leq 26$, $0.3 \leq e \leq 3$, and a $+b+c+d+e \geq 97$. A sputtering target for forming the recording layer is also disclosed.

14 Claims, 1 Drawing Sheet

FIGURE
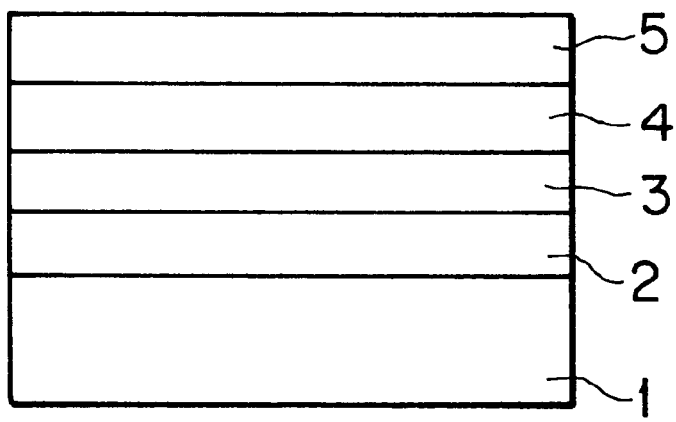

OPTICAL RECORDING MEDIUM AND SPUTTERING TARGET FOR FABRICATING THE RECORDING MEDIUM

BACKGROUND OF THE INVENTION

1. Field of the Invention

The present invention relates to an optical recording medium suitable for application to optical memory devices, in particular, a rewritable compact disk (CD-rewritable). More specifically, the present invention relates to a phase-change optical recording medium comprising a recording material in a recording layer thereof, which recording material is capable of causing a change in the phase thereof by the application of a light beam thereto, thereby recording, reading, erasing, and overwriting information therein.

In addition, the present invention also relates to a sputtering target for fabricating a recording layer of the above-mentioned optical recording medium.

2. Discussion of Background

A phase-change optical recording medium utilizing the phase changes between a crystalline phase and an amorphous phase or between one crystalline phase and another crystalline phase is well known as one of the optical recording media capable of recording, reading, and erasing information by the application thereto of electromagnetic waves, such as a laser beam.

This kind of phase-change optical recording medium enables the overwriting of information to be performed using a single beam, while it is difficult for the magneto-optical memory to conduct such an overwriting operation. An optical system of a drive unit for the phase-change optical recording medium can be made simpler than that for a magneto-optical recording medium, so that research and development of the phase-change optical recording medium has been actively conducted recent years.

As disclosed in U.S. Pat. No. 3,530,441, chalcogen-based alloys, such as Ge—Te, Ge—Te—Sn, Ge—Te—S, Ge—Se—S, Ge—Se—Sb, Ge—As—Se, In—Te, Se—Te, and Se—As are conventionally used as recording materials for the phase-change optical recording medium.

In addition, it is proposed to add an element of Au to the above-mentioned Ge—Te based alloy to improve the stability and to increase the rate of crystallization of the recording material as disclosed in Japanese Laid-Open Patent Application 61-219692. Furthermore, the addition of Sn and Au to the Ge—Te based alloy, and the addition of Pd to the same are respectively proposed in Japanese Laid-Open Patent Applications 61-270190 and 62-19490 for the same purposes as mentioned above. Furthermore, Ge—Te—Se—Sb and Ge—Te—Sb materials with the specific composition ratios of the constituent elements are proposed in order to improve the recording and erasing repetition properties, as respectively disclosed in Japanese Laid-Open Patent Applications 62-73438 and 63-228433.

However, none of the above-mentioned conventional optical recording media satisfies all the requirements for the rewritable phase-change optical memory medium. In particular, improvement of recording and erasing sensitivities, prevention of a decrease in erasability that results from imperfect erasure at the time of overwriting operation, and extension of the life of a recorded portion and a non-recorded portion are the most significant problems to be solved.

A recording medium is proposed in Japanese Laid-Open Patent Application 63-251290, which is provided with a recording layer comprising a compound of a multi-component system composed of substantially three or more components in a single crystalline phase. In this case, the recording layer is defined as a layer comprising a compound of a multi-component system composed of three or more components with a stoichiometric composition, for example, $In_3SbTe_2$, in an amount of 90 atom % or more. It is mentioned that recording and erasing characteristics can be improved to some extent by the provision of this kind of recording layer. However, there are the shortcomings that the erasability is low and the laser power necessary for recording and erasing cannot be sufficiently reduced.

Furthermore, Japanese Laid-Open Patent Application 1-277338 discloses an optical recording medium which comprises a recording layer comprising an alloy with a composition represented by formula of $(Sb_aTe_{1-a})_{1-b}M_b$, wherein $0.4 \leq a < 0.7$, $b \leq 0.2$, and M is one element selected from the group consisting of Ag, Al, As, Au, Bi, Cu, Ga, Ge, In, Pb, Pt, Se, Si, Sn, and Zn. The basic system of the aforementioned alloy is $Sb_2Te_3$, and the addition of a large excess of Sb to this composition in terms of atomic percentage achieves high-speed erasing performance and improves the repetition properties. The addition of the element M can further enhance the high-speed erasing performance. In addition to the above advantages, this reference asserts that the erasability is high when direct current (DC) light is used. However, this reference does not show any specific erasability obtained at the overwriting operation. According to the investigation conducted by the inventors of the present invention, imperfect erasure is recognized in the course of the overwriting operation. Further, the recording sensitivity is insufficient.

Japanese Laid-Open Patent Application 60-177446 discloses an optical recording medium which comprises a recording layer comprising an alloy with a composition represented by the formula of $(In_{1-x}Sb_z)_{1-y}M_y$, wherein $0.55 \leq x \leq 0.80$, $0 \leq y \leq 0.20$, and M is one element selected from the group consisting of Au, Ag, Cu, Pd, Pt, Al, Si, Ge, Ga, Sn, Te, Se, and Bi. Japanese Laid-Open Patent Application 63-228433 discloses a recording layer of an optical recording medium, which comprises an alloy with a composition of $GeTe$—$Sb_2Te_3$—$Sb$ (excess). However, any recording layers do not satisfy the requirements such as the sensitivity and the erasability.

In addition, Japanese Laid-Open Patent Application 4-163839 discloses an optical recording medium, which is provided with a recording thin layer prepared by adding nitrogen to a Te—Ge—Sb alloy. A recording thin layer of a recording medium disclosed in Japanese Laid-Open Patent Application 4-52188 is made of a Te—Ge—Se alloy, with at least one element of Te, Ge, or Se forming a nitride. Japanese Laid-Open Patent Application 4-52189 discloses a recording thin layer that is made of a Te—Ge—Se alloy, with nitrogen atom being adsorbed thereby.

However, any of these conventional optical recording media cannot exhibit satisfactory performance.

As mentioned above, to enhance the recording and erasing sensitivities, to prevent a decrease in erasability which is caused by imperfect erasure in the overwriting operation, and to increase the life of a recorded portion and that of a non-recorded portion are the most important research topics in the conventional phase-change optical recording media.

With the rapid spread of a compact disk (CD), a write-once compact disk (CD-R) capable of writing data therein only once has been developed and put on the market. However, even one error in the course of data recording makes the CD-R unavailable because it is impossible to correct the recorded data. There is no choice but to discard such a disk. The practical use of a rewritable compact disk that can compensate the above-mentioned shortcoming is desired.

For example, research and development of a rewritable compact disk has been conducted based on the magneto-optical recording disk. However, there are difficulties in performing the overwriting operation and ensuring the compatibility with the CD-ROM or CD-R. In contrast to this, a phase-change optical recording medium is considered to ensure the compatibility with the CD-ROM or CD-R more favorably in principle when compared with the above-mentioned rewritable compact disk of a magneto-optical type. The application of the phase-change optical recording medium to the rewritable compact disk has been thus actively researched and developed recent years.

Papers on the rewritable compact disk obtained from the phase-change optical disk are read, for instance, as Furuya et al., "Proceedings of the 4th Symposium on Phase-Change Recording" p.70 (1992); Jinno et al., "Proceedings of the 4th Symposium on Phase-Change Recording" P.76 (1992); Kawanishi et al., "Proceedings of the 4th Symposium on Phase-Change Recording" p.82 (1992); T. Handa et al., Jpn. J. Appl. Phys. 32 (1993) p.5226; Yoneda et al., "Proceedings of the 5th Symposium on Phase-Change Recording" p.9 (1993); and Tominaga et al., "Proceedings of the 5th Symposium on Phase-Change Recording" p.5 (1993). However, none of the rewritable compact disks reported in the aforementioned references is satisfactory with respect to the overall performance, such as the compatibility with CD-R, the recording and erasing performance, the recording sensitivity, the permissible repetition number of overwriting times, the permissible repetition number of reading times, the shelf stability, and so on. Those drawbacks largely result from low erasability that is considered to be chiefly ascribed to the composition and the structure of a recording material employed in each compact disk.

Under such present conditions, development of a phase-change recording material with high erasability, suitable for recording and erasing with sensitivity is demanded, and in addition, a rewritable phase-change compact disk with high performance is desired.

To solve the aforementioned conventional problems, the inventors of the present invention have proposed Ag—In—Sb—Te based recording materials, for example, as disclosed in Japanese Laid-Open Patent Applications 4-78031 and 4-123551; H. Iwasaki et al., Jpn. J. Appl. Phys. 31 (1992) 461; Ide et al., "Proceedings of the 3rd Symposium on Phase-Change Recording" p.102 (1991); and H. Iwasaki et al., Jpn. J. Appl. Phys. 32 (1993) 5241.

It is apparent that the phase-change optical disks with remarkably significant performance can be obtained by using the above-mentioned recording materials. However, still more endeavors should be made to complete the method of fabricating a phase-change optical disk worthy to form a new market by securely ensuring the compatibility with the CD-R and perfectly satisfying the previously mentioned overall performance.

SUMMARY OF THE INVENTION

It is therefore a first object of the present invention to provide an optical recording medium which can appropriately record information and erasing the same at a disk rotational linear speed ranging from 4 to 20 m/sec.

A second object of the present invention is to provide a phase-change optical recording medium applicable to a rewritable compact disk.

A third object of the present invention is to provide a sputtering target for fabricating a recording layer of the above-mentioned optical recording medium.

The above-mentioned first and second objects of the present invention can be achieved by an optical recording medium comprising a recording layer which comprises a phase-change recording material, capable of recording and erasing information by utilizing changes in the phase of the phase-change recording material in the recording layer, the phase-change recording material comprising as constituent elements Ag, In, Sb, and Te with the respective atomic percents of a, b, c, and d thereof being in the relationship of $0.1 \leq a \leq 5$, $5 \leq b \leq 13$, $62 \leq c \leq 73$, $22 \leq d \leq 26$, and $a+b+c+d \geq 97$.

Alternatively, the first and second objects of the present invention can be achieved by an optical recording medium comprising a recording layer which comprises a phase-change recording material, capable of recording and erasing information by utilizing changes in the phase of the phase-change recording material in the recording layer, the phase-change recording material comprising as constituent elements Ag, In, Sb, Te, and Ge, with the respective atomic percents of a, b, c, d, and e thereof being in the relationship of $0.1 \leq a \leq 5$, $5 \leq b \leq 13$, $62 \leq c \leq 73$, $22 \leq d \leq 26$, $0.3 \leq e \leq 3$, and $a+b+c+d+e \geq 97$.

From the aspect of the structure of the optical recording medium, it is preferable that the above-mentioned optical recording medium comprise a substrate in the form of a disk, and a first dielectric layer, either of the previously mentioned recording layers, a second dielectric layer, a metal layer, and a UV-curing resin layer, which are overlaid on the substrate in this order.

In any case, it is preferable that the thickness of the first dielectric layer be in the range of 20 to 200 nm; the thickness of the recording layer, 10 to 50 nm; the thickness of the second dielectric layer, 15 to 40 nm, and the thickness of the metal layer, 50 to 200 nm.

Further, it is preferable that the atomic percents c and d of the elements Sb and Te satisfy the relationship of $88 < c+d < 97$.

In any of the optical recording media, it is preferable that the metal layer comprise an Al alloy comprising Al and at least one element selected from the group consisting of Ta, Ti, Cr, and Si in an amount of 0.3 to 2.5 wt. %.

Alternatively, it is preferable that the metal layer comprise Ag and at least one element selected from the group consisting of Au, Pt, Pd, Ru, Ti, and Cu in an amount of 0 to 4 wt. %.

The third object of the present invention can be achieved by a sputtering target comprising a target material comprising as constituent elements Ag, In, Sb, and Te, with the respective atomic percents (atom. %) of a, b, c, and d thereof being in the relationship of $0.1 \leq a \leq 6$, $4 \leq b \leq 14$, $61 \leq c \leq 74$, $21 \leq d \leq 27$, and $a+b+c+d \geq 97$.

Alternatively, the third object of the present invention can be achieved by a sputtering target comprising a target material comprising as constituent elements Ag, In, Sb, Te, and Ge, with the respective atomic percents (atom. %) of a, b, c, d, and e thereof being in the relationship of $0.1 \leq a \leq 6$, $4 \leq b \leq 14$, $61 \leq c \leq 74$, $21 \leq d \leq 28$, $0.3 \leq e \leq 4$, and $a+b+c+d+e \geq 97$.

BRIEF DESCRIPTION OF THE DRAWING

A more complete appreciation of the invention and many of the attendant advantages thereof will be readily obtained as the same becomes better understood by reference to the following detailed description when considered in connection with the accompanying drawing, wherein:

a single FIGURE is a schematic cross sectional view of one embodiment of an optical recording medium according to the present invention, in explanation of the structure of layers for use in the recording medium.

DESCRIPTION OF THE PREFERRED EMBODIMENTS

A four-component system compound of Ag, In, Te, and Sb is suitable for a recording material for use in a phase-change optical recording medium. This is because the above-mentioned recording material can readily assume an amorphous state with high sensitivity, thereby exhibiting excellent recording sensitivity and speed, and the recording material can readily assume a crystalline state with high sensitivity, thereby exhibiting excellent erasing sensitivity and speed. Further, in this case, the erasability is quite satisfactory. The composition ratios of Ag, In, Sb, and Te worthy to obtain good disk characteristics are as previously mentioned. Namely, the phase-change recording material for use in the present invention comprises as constituent elements Ag, In, Sb, and Te, with the respective atomic percents of a, b, c, and d thereof being in the relationship of $0.1 \leq a \leq 5$, $5 \leq b \leq 13$, $62 \leq c \leq 73$, $22 \leq d \leq 26$, and $a+b+c+d>97$.

Alternatively, the phase-change recording material comprises as constituent elements Ag, In, Sb, Te, and Ge, with the respective atomic percents of a, b, c, d, and e thereof being in the relationship of $0.1 \leq a \leq 5$, $5 \leq b \leq 13$, $62 \leq c \leq 73$, $22 \leq d \leq 26$, $0.3 \leq e \leq 3$, and $a+b+c+d+e \geq 97$.

For obtaining better recording and erasing characteristics, it is desirable that the atomic percents of c and d of the elements Sb and Te satisfy the relationship of $88<c+d<97$.

In the phase-change optical recording medium of the present invention, the composition of the recording layer is measured based on the emission spectroscopic analysis. In addition to the emission spectroscopic analysis, X-ray microanalysis, Rutherford back scattering, Auger electron spectroscopic analysis, and X-ray fluorescence analysis can be employed to measure the composition of the recording layer. In such a case, however, calibration is necessary with reference to the composition obtained by the emission spectroscopic analysis.

The X-ray diffraction or electron diffraction is appropriate for observing the condition of the recording layer. Namely, when a spot pattern or Debye-Scherrer ring pattern is observed in the recording layer by the electron diffraction, the recording layer is considered to assume a crystalline state; while a ring pattern or halo pattern is observed therein, the recording layer is considered to assume an amorphous state. The particle size of the crystallites for use in the recording layer can be obtained by calculation, for instance, in accordance with the Scherrer equation, from the width of a main peak obtained from the X-ray diffraction. To be more specific, the particle size of the crystallites can be obtained in accordance with the Scherrer equation, that is, $B=b+(K\lambda)/(D\cos\theta)$, wherein B is the angle of diffracted light by scattering, b is a value determined from an experiment, K is the Scherrer's constant, $\lambda$ is the wavelength of X-ray used for diffraction, D is the particle size of crystallites, and $\theta$ is the incident angle of X-ray applied to the surface of the crystallite.

Further, the chemical bonding condition of the constituent elements in the recording layer, for example, the chemical bonding of an oxide or nitride existing in the recording layer can be efficiently analyzed by Fourier transform infrared spectroscopic analysis (FT-IR) or X-ray photoelectron spectrometry (XPS).

The thickness of the recording layer deposited by use of the sputtering target of the present invention is preferably in the range of 10 to 50 nm, and more preferably in the range of 12 to 25 nm. When the thickness of the recording layer is 10 nm or more, the light absorbing capability of the recording layer is sufficient. When the thickness of the recording layer is 50 nm or less, the phase change can uniformly and speedily take place in the recording layer.

The sputtering target of the present invention comprises a target material comprising as constituent elements Ag, In, Sb, and Te, with the respective atomic percents (atom. %) of a, b, c, and d thereof being in the relationship of $0.1 \leq a \leq 6$, $4 \leq b \leq 14$, $61 \leq c \leq 74$, $21 \leq d \leq 27$, and $a+b+c+d \geq 97$.

Alternatively, the sputtering target of the present invention comprises a target material comprising as constituent elements Ag, In, Sb, Te, and Ge, with the respective atomic percents (atom. %) of a, b, c, d, and e thereof being in the relationship of $0.1 \leq a \leq 6$, $4 \leq b \leq 14$, $61 \leq c < 74$, $21 \leq d \leq 28$, $0.3 \leq e \leq 4$, and $a+b+c+d+e \geq 97$.

It is preferable that the target material for use in the above-mentioned sputtering target comprise Sb, and $AgInTe_2$ with a stoichiometric composition and/or a nearly stoichiometric composition having a chalcopyrite structure and/or zincblende structure. When a thin recording layer is deposited by sputtering by use of the aforementioned target, and the deposited recording layer is then subjected to proper treatment for initialization, a mixed phase of a crystalline phase of $AgSbTe_2$ and an In—Sb amorphous phase can be obtained. This is reported in "Proceedings of the 3rd Symposium on Phase-Change Recording" p. 102 (1991), and "Japanese Journal of Applied Physics" vol. 32 (1993) pp. 5241–5247. It is conventionally known that an optical recording medium with high erasability, capable of repeatedly carrying out the recording operation and the erasing operation by the application of a low power can be obtained when the above-mentioned mixed phase is provided as a non-recorded state of the recording layer.

In the target material, it is preferable that the $AgInTe_2$ in the form of crystallites have a particle size of less than 45 nm.

The particle size of the $AgInTe_2$ crystallites for use in the target material can be determined by calculation, for instance, in accordance with the Scherrer equation, from the width of a main peak obtained by the X-ray diffraction of the pulverized particles of the target material. For instance, when Cu is employed for the source of X-ray and $\lambda$ is about 1.54 Å, the width of the main peak is about 24.1°. It is necessary that the width of the peak be corrected with reference to the main peak of a reference sample with a sufficiently large particle size. In the case where the $AgInTe_2$ crystallites have a particle size of 45 nm or more, it becomes difficult to obtain such a condition that can ensure stable recording and erasing even if proper treatment is taken after the thin recording layer is deposited.

According to the present invention, the recording layer for the optical recording medium can be formed by sputtering the previously mentioned target of the present invention in an atmosphere of argon gas, with nitrogen gas being contained therein at a concentration in a range of 0 to 10 mol %. According to the concentration of the nitrogen gas in the atmosphere during the sputtering step, the composition of the obtained recording layer can be optimally adjusted so as to be fittest for the desired rotational linear speed of the disk, the structure of layers in the disk, and the operating conditions of the disk. By use of a mixed gas of nitrogen gas and argon gas in the course of sputtering, the recording and erasing repetition reliability of the obtained recording medium is improved. The mixed gas used in the sputtering step may be prepared by mixing nitrogen gas and argon gas at a predetermined mixing ratio before introduced into a sputter chamber. Alternatively, the argon gas and the nitrogen gas are separately introduced into the sputter chamber with the respective flow rates being controlled so as to obtain a desired molar ratio in the sputter chamber.

When the content of nitrogen in the obtained recording layer is 4 atom. % or less, the disk characteristics of the obtained optical recording medium are excellent. To be more specific, not only the repetition number of overwriting (O/W) times can be increased, but also the modulation degree and the shelf life of a recorded mark (amorphous mark) can be improved. All the details of the mechanism resulting in such improvement of the disk characteristics have not been clarified. It is considered that the addition of a proper amount of nitrogen to the recording layer decreases the density of the recording layer and increases minute voids, whereby the randomness of the recording layer tends to increase in terms of the configuration. As a result, the degree of order in the recording layer is moderated when compared with the case where no nitrogen is added to the recording layer. Therefore, the transition from the amorphous phase to the crystalline phase is apt to be restrained, so that the stability of the amorphous mark is increased and the shelf life of the amorphous mark is improved.

Furthermore, another advantage obtained by the addition of nitrogen to the recording layer is that the transition linear speed can be controlled. To be more specific, the optimum recording linear speed can be shifted to the lower linear speed side by the addition of nitrogen to the recording layer. Even though the composition of the target is identical, the optimum recording linear speed of the phase-change optical recording disk can be controlled simply by adjusting the mixing ratio of nitrogen gas in the $N_2$/Ar gas introduced into the atmosphere during the sputtering step.

With respect to the chemical bonding condition of nitrogen in the recording layer, it is desirable that nitrogen be chemically bonded to at least one of Ag, In, Te, or Sb. In particular, when nitrogen is bonded to Te, for example, in the form of a Te—N or Sb—Te—N bond in the recording layer, the repetition number of overwriting times can be effectively increased. Such chemical bonding condition in the recording layer can be analyzed by the FT-IR or XPS, as previously mentioned. For instance, a Te—N bond gives rise to peaks in the 500 to 600 $cm^{-1}$ region; and absorptions arising from an Sb—Te—N bond occur in the 600 to 650 $cm^{-1}$ region by the FT-IR analysis.

In the present invention, the phase-change optical recording material may further comprise other elements and impurities for the purpose of still more improvement of the performance and increase of the reliability. For instance, elements as disclosed in Japanese Patent Application 4-1488, that is, B, N, C, P, and Si; and other elements such as O, S, Se, Al, Ti, V, Mn, Fe, Co, Ni, Cu, Zn, Ga, Ge, Sn, Pd, Pt, and Au can be given as preferable examples. In particular, the addition of Ge to the recording layer produces the effect of improving the storage reliability of recorded signals and increasing the repetition number of overwriting times.

The present invention will now be explained in detail with reference to the single FIGURE.

This FIGURE is a schematic cross-sectional view showing one embodiment of the layer structure in the phase-change optical recording medium according to the present invention. As shown in the FIGURE, a first dielectric layer (heat-resistant protective layer) 2, a recording layer 3, a second dielectric layer (heat-resistant protective layer) 4, and a metal layer (reflection and heat dissipation layer) 5 are successively overlaid on a substrate 1 bearing a groove thereon. It is not always necessary to provide the first dielectric layer 2 and the second dielectric layer 4 on both sides of the recording layer 3. However, it is desirable to provide the first dielectric layer 2 when a material with low heat resistance, such as polycarbonate resin, is employed for the substrate 1.

In the present invention, glass, ceramics, and resins are used as the materials for the substrate 1 of the optical recording medium. In particular, the resin substrate is advantageous from the viewpoints of manufacturing cost and moldability.

Examples of the resin as the material for the substrate 1 include polycarbonate resin, acrylic resin, epoxy resin, polystyrene resin, acrylonitrile—styrene copolymer resin, polyethylene resin, polypropylene resin, silicone resin, fluoroplastics, ABS resin, and urethane resin. Of those resins, the polycarbonate resin and the acrylic resin are suitable for the substrate 1 because of their advantages of good processability and optical properties. The substrate may be prepared in the form of a disk, card, or sheet.

When the phase-change optical recording medium of the present invention is applied to a rewritable compact disk (CD-Rewritable), it is desirable that the substrate 1 bear a guide groove with a width, that is, a half width of 0.25 to 0.65 μm, preferably 0.30 to 0.55 μm, and a depth of 20 to 60 nm, preferably 25 to 50 nm.

The combination of the above-mentioned condition of the substrate concerning the guide groove, the recording material with a specific composition, and the layer structure in a disk can provide a rewritable compact disk with excellent compatibility.

More specifically, the push-pull magnitude after recording (PPm) is prescribed as one of the significant groove signal characteristics by the reference for CD specifications, that is, Orange Book. According to the Orange Book, the push-pull magnitude after recording (PPm) of the compact disk is required to be in the range of 0.06 to 0.15, preferably 0.08 to 0.14, and more preferably 0.08 to 0.12.

It is very difficult for the conventional rewritable phase-change compact disk to both satisfy the principal recording and reading characteristics, and meet the above-mentioned standard requirements of the groove signal characteristics. A rewritable compact disk capable of satisfying all the practical requirements can be first realized by the present invention.

Specific examples of the material for use in the first and second dielectric layers 2 and 4 are metallic oxides such as SiO, $SiO_2ZnO$, $SnO_2$, $Al_2O_3$, $TiO_2$, $In_2O_3MgO$, and $ZrO_2$; nitrides such as $Si_3N_4$, AlN, TiN, BN, and ZrN; sulfides such as ZnS, $In_2S_3$, and $TaS_4$; carbides such as SiC, TaC, $B_4C$, WC, TiC, and ZrC; and carbon with a diamond structure. The dielectric layer 2 or 4 can be prepared by use of a single material or a mixture of these materials. Further, the dielectric layer 2 or 3 may further comprise an impurity, when necessary, as long as the melting points of the first and second dielectric layers 2 and 4 are higher than that of the recording layer 3.

The first and second dielectric layers 2 and 4 for use in the present invention can be provided by various vapor growth methods, for example, vacuum deposition, sputtering, plasma chemical vapor deposition, photochemical vapor deposition, ion plating, and electron beam deposition method.

It is preferable that the thickness of the first dielectric layer 2 be in the range of 20 to 200 nm, and more preferably in the range of 30 to 120 nm. When the thickness of the first dielectric layer 2 is 20 nm or more, the first dielectric layer 2 can fulfil its function to work as a heat-resistant protective layer. In addition, when the first dielectric layer 2 has a thickness of 200 nm or less, a decrease in sensitivity can be prevented, and the peeling of the dielectric layer 2 does not easily take place. When necessary, the first dielectric layer 2 may be of a multi-layered type.

It is preferable that the thickness of the second dielectric layer 4 be in the range of 15 to 40 nm, and more preferably in the range of 20 to 35 nm. When the thickness of the second dielectric layer 4 is 15 nm or more, the second dielectric layer 4 can fulfil its function to serve as a heat-resistant protective layer. In addition, when the second dielectric layer 4 has a thickness of 40 nm or less, the peeling can be prevented and the repetition recording properties do not decrease. The second dielectric layer 4 may also be of a multi-layered type.

Specific examples of the material for the metal layer 5 (reflection and heat dissipation layer) include metals such as Al, Au, Ag, and Cu; and alloys thereof. In particular, Al alloys, and Ag and Ag alloys are especially advantageous in terms of the cost and the environmental resistance. With respect to the Al alloy, it is preferable that Al alloy comprise Al and at least one element selected from the group consisting of Ta, Ti, Cr, and Si in an amount of 0.3 to 2.5 wt. %. When the metal layer 5 is made of Ag or an Ag alloy, it is effective that the Ag alloy comprise at least one element selected from the group consisting of Au, Pt, Pd, Ru, Ti, and Cu in an amount of 4 wt. % or less.

The metal layer 5 can be provided by various kinds of vapor growth methods such as vacuum deposition, sputtering, plasma chemical vapor deposition, photochemical vapor deposition, ion-plating, and electron beam deposition method.

The metal layer 5 is required to effectively allow heat to escape. In view of this point, it is preferable that the thickness of the metal layer 5 be in the range of 50 to 200 nm, and more preferably in the range of 70 to 180 nm. When the metal layer 5 is excessively thick, the heat dissipating efficiency becomes too high to maintain good sensitivity. When the thickness of the metal layer 5 is less than 50 nm, the repetition overwriting properties are degraded although the sensitivity is satisfactory. In addition, the metal layer 5 is required to have a high thermal conductivity, high melting point, and good adhesion to the dielectric layer.

On the metal layer, an overcoat layer may be provided to protect the metal layer from oxidation. To provide such an overcoat layer, an ultraviolet-curing resin is preferably spin-coated on the metal layer. It is preferable that the thickness of the overcoat layer be in the range of 3 to 15 $\mu$m. When the thickness is 3 $\mu$m or more, occurrence of error can be reduced even if a printing layer is further overlaid on the overcoat layer. On the other hand, when the thickness is 15 $\mu$m or less, an increase in internal stress can be prevented, so that no adverse effect is produced on the mechanical characteristics of the obtained disk.

As the electromagnetic waves used for initializing the obtained recording layer, and carrying out the recording, reading, and erasing operations, there can be employed laser beams, ultraviolet rays, visible rays, infrared rays, microwave, and the like. In particular, semiconductor laser beam is most advantageously used as the electromagnetic wave in the recording, reading, and erasing operations because a system for driving the optical recording medium can be made compact.

Other features of this invention will become apparent in the course of the following description of exemplary embodiments, which are given for illustration of the invention and are not intended to be limiting thereof.

EXAMPLES 1 TO 10 AND COMPARATIVE
EXAMPLES 1 TO 7

An 80-nm thick first dielectric layer of ZnS. $SiO_2$ was provided on a polycarbonate substrate with a thickness of 1.2 mm bearing thereon a guide groove having a width of 0.6 $\mu$m, a depth of 40 nm, and a track pitch of 1.6 $\mu$m.

On the first dielectric layer, a recording layer with a thickness of 18 nm was deposited using a sputtering target with a composition as shown in TABLE 1.

Further, a 32-nm thick second dielectric layer of ZnS-$SiO_2$, a 160-nm thick metal layer made of an aluminum alloy comprising Ti in an amount of 1.5 wt. %, and a 10-$\mu$m thick ultraviolet-curing resin layer were successively overlaid on the recording layer in this order.

TABLE 1 shows the composition of the sputtering target for fabricating each recording layer, and the composition of the obtained recording layer.

The recording layer was deposited on the first dielectric layer by sputtering under such conditions that the applied pressure was adjusted to $3 \times 10^{-3}$ Torr during the sputtering process, and the RF power was set at 500 W, with argon gas being introduced into a sputter chamber at a rate of 10 sccm (standard cubic centimeter per minute).

Thus, disk-shaped optical recording media Nos. 1 to 10 according to the present invention and comparative disk-shaped optical recording media Nos. 1 to 7 were fabricated.

The disk characteristics of each of the above-mentioned phase-change optical recording media Nos. 1 to 10 according to the present invention and comparative phase-change optical recording media Nos. 1 to 7 were evaluated as follows.

Recording was carried out by rotating each disk at an optimal linear speed within the range of 4 to 20 m/sec. The signals were modulated in accordance with an Eight to Fourteen Modulation (EFM) system, and multi-pulse patterns were employed when the disk was irradiated with a semiconductor laser beam. The wavelength of the semiconductor laser beam was 780 nm, and the numerical aperture (NA) value of the objective lens was 0.5.

After completion of the recording, the reflectance of the recorded portion was measured. Further, the repetition number of overwriting times was counted. The results are also shown in TABLE 1. In TABLE 1, "x" is the symbol indicating that data was written once, but it was impossible to overwrite the data.

TABLE 1

| | Composition of Sputtering Target (atom. %) | | | | | Composition of Recording Layer (atom. %) | | | | | Reflectance (%) | Repetition Number of O/W Times |
|---|---|---|---|---|---|---|---|---|---|---|---|---|
| | Ag | In | Sb | Te | Ge | Ag | In | Sb | Te | Ge | | |
| Ex. 1 | 1.0 | 9.0 | 66.0 | 24.0 | 0.0 | 0.9 | 9.1 | 66.2 | 23.8 | 0.0 | 18 | 2000 |
| Ex. 2 | 2.0 | 7.0 | 67.0 | 24.0 | 0.0 | 2.1 | 6.9 | 67.1 | 23.9 | 0.0 | 19 | 3500 |
| Ex. 3 | 4.0 | 7.5 | 62.5 | 26.0 | 0.0 | 4.1 | 7.6 | 62.4 | 25.9 | 0.0 | 16 | 2000 |
| Ex. 4 | 0.5 | 5.5 | 71.5 | 22.5 | 0.0 | 0.6 | 5.5 | 71.6 | 22.5 | 0.0 | 21 | 2300 |
| Ex. 5 | 1.5 | 6.0 | 70.0 | 22.5 | 0.0 | 1.6 | 5.9 | 70.1 | 22.4 | 0.0 | 21 | 3000 |
| Ex. 6 | 1.5 | 9.0 | 63.5 | 26.0 | 0.0 | 1.5 | 10.1 | 62.6 | 25.8 | 0.0 | 18 | 2800 |
| Ex. 7 | 1.0 | 12.5 | 64.5 | 22.0 | 0.0 | 1.1 | 12.6 | 64.4 | 21.9 | 0.0 | 16 | 2500 |
| Ex. 8 | 1.0 | 7.0 | 66.0 | 26.0 | 1.0 | 0.9 | 7.1 | 66.0 | 26.1 | 0.9 | 20 | 2500 |
| Ex. 9 | 0.5 | 7.5 | 65.0 | 25.0 | 2.0 | 0.6 | 7.6 | 64.9 | 24.9 | 2.0 | 18 | 3800 |
| Ex. 10 | 1.0 | 5.0 | 65.0 | 24.0 | 3.0 | 1.1 | 4.9 | 64.8 | 24.1 | 3.1 | 19 | 2000 |
| Comp. Ex. 1 | 6.0 | 5.0 | 65.0 | 24.0 | 0.0 | 5.9 | 5.1 | 64.9 | 24.1 | 0.0 | 19 | 300 |
| Comp. Ex. 2 | 2.0 | 1.0 | 73.5 | 24.0 | 0.0 | 2.0 | 1.1 | 73.4 | 24.0 | 0.0 | 23 | x |
| Comp. Ex. 3 | 3.0 | 11.5 | 60.0 | 25.5 | 0.0 | 2.9 | 11.4 | 60.1 | 25.6 | 0.0 | 14 | 600 |
| Comp. Ex. 4 | 1.0 | 7.5 | 63.5 | 28.0 | 0.0 | 1.1 | 7.4 | 63.4 | 28.1 | 0.0 | 20 | 500 |
| Comp. Ex. 5 | 1.0 | 7.5 | 63.0 | 22.5 | 6.0 | 1.0 | 7.6 | 63.0 | 22.4 | 6.0 | 13 | x |
| Comp. Ex. 6 | 4.5 | 5.5 | 62.5 | 27.5 | 0.0 | 4.4 | 5.6 | 62.4 | 27.6 | 0.0 | 19 | x |
| Comp. Ex. 7 | 5.5 | 4.0 | 63.0 | 26.5 | 1.0 | 5.4 | 4.1 | 62.9 | 26.6 | 1.0 | 18 | x |

As is apparent from TABLE 1, when the composition ratios of Ag, In, Sb, Te, and Ge, respectively indicated by a, b, c, d, and e, satisfy the conditions of $0.1 \leq a \leq 5$, $5 \leq b \leq 13$, $62 \leq c \leq 73$, $22 \leq d \leq 26$, and $0.3 \leq e \leq 3$ in terms of the atomic percentage, excellent disk characteristics can be obtained. In particular, when $88 < (c+d) < 97$, sufficient reflectance can be obtained.

In contrast to this, the reflectances are as low as 14% or less in Comparative Examples 3 and 5. This is because the sum of the composition ratios of Sb and Te is 88 atom. % or less. In this case, the compatibility of the disk with a CD-ROM drive is lowered in the reading operation. Further, the recording characteristics are also lowered during the repetition of the recording operations. On the other hand, when the sum of the composition ratios of Sb and Te exceeds 97 atom. % in the recording layer as in Comparative Example 2, the reflectance becomes too high to gain an ample signal amplitude. The result is that the error occurrence ratio tends to increase in the reading operation. Furthermore, in Comparative Examples 6 and 7, the overwriting operation is impossible at a linear speed of 4 m/sec or more.

Each sputtering target for fabricating the recording layer employed in Examples 1 to 10 and Comparative Examples 1 to 7 was produced by fusing the constituent elements to prepare a fused mixture, rapidly cooling the fused mixture to prepare a solid lump, pulverizing the solid lump to prepare finely-divided particles, and sintering the finely-divided particles.

EXAMPLE 11

The procedure for fabricating the disk-shaped optical recording medium No. 2 in Example 2 was repeated except that the argon gas containing a nitrogen gas at a concentration of 6.0, 10.0, or 15.0 mol % was introduced into the sputter chamber when the recording layer was deposited on the first dielectric layer by sputtering.

Thus, disk-shaped optical recording media according to the present invention were fabricated.

TABLE 2 shows the composition of each of the thus obtained recording layers in terms of the atomic percents of constituent elements.

In the same manner as in Example 1, the repetition number of overwriting times was counted.

The results are also shown in TABLE 2.

TABLE 2

| $N_2/(Ar + N_2)$ (mol %) | Composition of Recording Layer (atom. %) | | | | | Repetition Number of O/W Times |
|---|---|---|---|---|---|---|
| | Ag | In | Sb | Te | N | |
| 0 | 2.1 | 6.9 | 67.1 | 23.9 | 0 | 3500 |
| 6.0 | 1.7 | 6.6 | 66.3 | 23.4 | 2.0 | 5000 |
| 10.0 | 1.5 | 6.4 | 65.2 | 22.9 | 4.0 | 6000 |
| 15.0 | 1.4 | 6.3 | 64.7 | 22.6 | 5.0 | 500 |

As can be seen from the results in TABLE 2, when the concentration of nitrogen in the mixed gas is adjusted to 10 mol % or less, the maximum number of repeated overwriting operations is satisfactory.

EXAMPLES 12 TO 29

The procedure for fabricating the disk-shaped optical recording medium No. 1 in Example 1 was repeated except that the provision of the UV-curing resin layer was omitted and that the material for the metal layer was changed as shown in TABLE 3.

Thus, disk-shaped optical recording media No. 12 to No. 29 according to the present invention were fabricated.

TABLE 3

|  | Composition of Metal Layer (ratio by weight) | Reflectance (%) | Repetition Number of O/W Times |
|---|---|---|---|
| Ex. 12 | $Al_{99.5}Ti_{0.5}$ | 19 | 2000 |
| Ex. 13 | $Al_{97.5}Ti_{2.5}$ | 17 | 3000 |
| Ex. 14 | $Al_{98.5}Ta_{1.5}$ | 18 | 3000 |
| Ex. 15 | $Al_{98.5}Cr_{1.5}$ | 17 | 2500 |
| Ex. 16 | $Al_{98.5}Si_{1.5}$ | 19 | 1500 |
| Ex. 17 | $Al_{98.5}Ti_{1.0}Ta_{0.5}$ | 18 | 3000 |
| Ex. 18 | $Ag_{100}$ | 20 | 3000 |
| Ex. 19 | $Ag_{98}Pd_2$ | 18 | 4000 |
| Ex. 20 | $Ag_{98}Cu_2$ | 19 | 3000 |
| Ex. 21 | $Ag_{98}Au_2$ | 19 | 5000 |
| Ex. 22 | $Ag_{98}Pt_2$ | 19 | 4000 |
| Ex. 23 | $Ag_{96}Pd_2Cu_2$ | 17 | 3000 |
| Ex. 24 | $Ag_{98}Ru_2$ | 18 | 4000 |
| Ex. 25 | $Ag_{98}Ti_2$ | 19 | 5000 |
| Ex. 26 | $Al_{95}Ti_5$ | 14 | 200 |
| Ex. 27 | $Al_{99}Mg_1$ | 18 | 100 |
| Ex. 28 | $Al_{98.5}Cu_{1.5}$ | 14 | 300 |
| Ex. 29 | $Ag_{94}Pd_6$ | 13 | 200 |

As can bee seen from TABLE 3, it is preferable that the metal layer comprise an Al alloy containing at least one element selected from the group consisting of Ta, Ti, Cr, and Si, in an amount of 0.3 to 2.5 wt. %. Or, Ag or an alloy thereof containing at least one element selected from the group consisting of Au, Pt, Pd, Ru, Ti, and Cu, in an amount of 4 wt. % or less is preferably employed for the metal layer. In both cases, the overwriting characteristics are excellent.

In contrast to this, a decrease in reflectance is observed in Examples 26, 28 and 29. The reflectances obtained in Examples 26, 28, and 29 do not satisfy the standard requirement for the CD-Rewritable, that is, in a range of 15 to 25%.

Each of the recording disks Nos. 12 to 29 was allowed to stand at 80° C. and 85% RH for 300 hours. Though the recording disk No. 27 shows an increase in error occurrence during the overwriting operation after the storage, the storage stability of other disks was quite satisfactory.

Japanese Patent Application No. 2000-155389 filed May 25, 2000 is hereby incorporated by reference.

What is claimed is:

1. An optical recording medium, comprising:
    a recording layer which comprises a phase-change recording material, capable of recording and erasing information by utilizing changes in the phase of said phase-change recording material in said recording layer, said phase-change recording material comprising as constituent elements Ag, In, Sb, and Te;
    wherein the respective atomic percents of a, b, c, and d satisfy the following relationships:
    $0.1 \leq a \leq 5$,
    $5 \leq b \leq 13$,
    $62 \leq c \leq 73$,
    $22 \leq d \leq 26$, and
    $a+b+c+d \geq 97$; and
    wherein said atomic percents c and d of said elements Sb and Te satisfy the relationship of $88 < c+d < 97$.

2. An optical recording medium, comprising:
    a recording layer which comprises a phase-change recording material, capable of recording and erasing information by utilizing changes in the phase of said phase-change recording material in said recording layer, said phase-change recording material comprising as constituent elements Ag, In, Sb, Te, and Ge,
    wherein the respective atomic percents of a, b, c, d, and e satisfy the following relationships:
    $0.1 \leq a \leq 5$,
    $5 \leq b \leq 13$,
    $62 \leq c \leq 73$,
    $22 \leq d \leq 26$,
    $0.3 \leq e \leq 3$, and
    $a+b+c+d+e \geq 97$.

3. The optical recording medium as claimed in claim 1, further comprising:
    a substrate in the form of a disk,
    a first dielectric layer which is provided on said substrate and below said recording layer,
    a second dielectric layer which is provided on said recording layer,
    a metal layer which is provided on said second dielectric layer, and
    an UV-curing resin layer which is provided on said metal layer.

4. The optical recording medium as claimed in claim 2, further comprising:
    a substrate in the form of a disk,
    a first dielectric layer which is provided on said substrate and below said recording layer,
    a second dielectric layer which is provided on said recording layer,
    a metal layer which is provided on said second dielectric layer, and
    an UV-curing resin layer which is provided on said metal layer.

5. The optical recording medium as claimed in claim 3, wherein said first dielectric layer has a thickness in a range of 20 to 200 nm, said recording layer has a thickness in a range of 10 to 50 nm, said second dielectric layer has a thickness in a range of 15 to 40 nm, and said metal layer has a thickness in a range of 50 to 200 nm.

6. The optical recording medium as claimed in claim 4, wherein said first dielectric layer has a thickness in a range of 20 to 200 nm, said recording layer has a thickness in a range of 10 to 50 nm, said second dielectric layer has a thickness in a range of 15 to 40 nm, and said metal layer has a thickness in a range of 50 to 200 nm.

7. The optical recording medium as claimed in claim 2, wherein said atomic percents c and d of said elements Sb and Te satisfy the relationship of $88 < c+d < 97$.

8. The optical recording medium as claimed in claim 5, wherein said metal layer comprises an Al alloy comprising Al and at least one element selected from the group consisting of Ta, Ti, Cr, and Si in an amount of 0.3 to 2.5 wt. %.

9. The optical recording medium as claimed in claim 6, wherein said metal layer comprises an Al alloy comprising Al and at least one element selected from the group consisting of Ta, Ti, Cr, and Si in an amount of 0.3 to 2.5 wt. %.

10. The optical recording medium as claimed in claim 5, wherein said metal layer comprises Ag and at least one element selected from the group consisting of Au, Pt, Pd, Ru, Ti, and Cu in an amount of 0 to 4 wt. %.

11. The optical recording medium as claimed in claim 6, wherein said metal layer comprises Ag and at least one element selected from the group consisting of Au, Pt, Pd, Ru, Ti, and Cu in an amount of 0 to 4 wt. %.

12. A sputtering target, comprising:
    a target material comprising as constituent elements Ag, In, Sb, and Te, wherein the respective atomic percents of a, b, c, and d satisfy the following relationships:

$0.1 \leq a \leq 6$,
$4 \leq b \leq 14$,
$61 \leq c \leq 74$,
$21 \leq d \leq 27$ and
$a+b+c+d \geq 97$; and
wherein said atomic percents c and d of said elements Sb and Te satisfy the relationship of $88 < c+d < 97$.

13. A sputtering target, comprising:
a target material comprising as constituent elements Ag, In, Sb, Te, and Ge,
wherein the respective atomic percents of a, b, c, d, and e satisfy the following relationships:

$0.1 \leq a \leq 6$,
$4 \leq b \leq 14$,
$61 \leq c \leq 74$,
$21 \leq d \leq 28$,
$0.3 \leq e \leq 4$ and
$a+b+c+d+e \geq 97$.

14. The sputtering target as claimed in claim 13, wherein said atomic percents c and d of said elements Sb and Te satisfy the relationship of $88 < c+d < 97$.

* * * * *